(12) United States Patent
Iorga et al.

(10) Patent No.: US 6,894,552 B2
(45) Date of Patent: May 17, 2005

(54) LOW-JITTER DELAY CELL

(75) Inventors: Cosmin Iorga, Oak Park, CA (US);
Alan Hussey, Oak Park, CA (US);
Kuok Ling, Calabasas, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/376,664

(22) Filed: Feb. 28, 2003

(65) Prior Publication Data

US 2004/0169540 A1 Sep. 2, 2004

(51) Int. Cl.⁷ .............................................. H03H 11/26
(52) U.S. Cl. ..................................... 327/280; 327/287
(58) Field of Search ................................ 327/261–264, 327/266, 274, 276–278, 280–281, 284–285, 287–288, 65–66, 562–563, 269–272; 330/257, 261

(56) References Cited

U.S. PATENT DOCUMENTS

| | | | | | |
|---|---|---|---|---|---|
| 4,659,979 | A | * | 4/1987 | Burnham et al. ........... 323/312 |
| 4,800,303 | A | * | 1/1989 | Graham et al. ............... 326/72 |
| 5,714,912 | A | * | 2/1998 | Fiedler et al. ................ 331/57 |
| 5,789,981 | A | * | 8/1998 | Singer et al. ............... 330/253 |
| 5,994,939 | A | * | 11/1999 | Johnson et al. ............. 327/280 |
| 6,081,166 | A | * | 6/2000 | Katakura ...................... 331/57 |
| 6,157,266 | A | * | 12/2000 | Tsai et al. ...................... 331/57 |
| 6,175,260 | B1 | * | 1/2001 | Cho ............................ 327/280 |
| 6,348,839 | B1 | * | 2/2002 | Aramaki ....................... 331/57 |
| 6,686,788 | B2 | * | 2/2004 | Kim et al. .................. 327/280 |

* cited by examiner

*Primary Examiner*—My-Trang Nuton
(74) *Attorney, Agent, or Firm*—Teradyne Legal Department

(57) ABSTRACT

A differential delay cell is disclosed. The delay cell includes a voltage bus and a differential pair of MOS transistors having respective source terminals coupled to define a current node, and respective drain terminal outputs that cooperate to form a differential output. A current source is disposed at the current node while a differential diode-connected load is disposed between the differential pair and the voltage bus. The differential diode-connected load comprises at least one n-channel MOS transistor configured as a diode.

18 Claims, 5 Drawing Sheets

LOW-JITTER DELAY CELL

FIELD OF THE INVENTION

The invention relates generally to automatic test equipment, and more particularly low jitter timing generation circuits for automatic test equipment applications.

BACKGROUND OF THE INVENTION

Timing edge placement is often a critical parameter for high performance semiconductor testers. Having the ability to place the rising and/or falling edge of a test signal within a few picoseconds of a desired point in time may mean the difference in passing or failing large numbers of semiconductor devices under test.

Conventional timing generators that produce high accuracy timing signals are often employed in CMOS integrated circuits. CMOS technology provides relatively good performance at very low cost. However, CMOS ICs are often susceptible to temperature and other conditions that affect the performance of the circuit. To counter this, many CMOS timing generators employ sophisticated compensation techniques to minimize changes in delay.

With reference to FIG. 1, a conventional CMOS timing generator 10 that provides for temperature compensation typically includes a plurality of delay elements D1–DN coupled together to form a delay line. Each of the delay element outputs serve as timing selection inputs to a timing signal selector (not shown). The same outputs are also used for a delay compensation scheme. A compensation multiplexer 12 is employed, that receives the delay outputs, and provides an output to a phase detector 14, where it is compared to a reference signal Vref to determine any phase difference. A compensation voltage is then generated in response to the magnitude of any phase difference, and fed to a charge pump or voltage-to-current converter 16. The current generated by the converter is provided as bias current to the delay elements to control the delay.

FIG. 2 illustrates the conventional delay cell D1 in further detail. The basic cell is implemented by a differential pair of n-channel MOS transistors Qin1, Qin2 with MOS loads L1 and L2. A current source Ibias provides bias current through the differential pair and the loads. The loads comprise p-channel diode-connected MOS transistors Qdc11, Qdc12 in parallel with respective current source loads Qcs11, Qcs12. Typically, p-channel MOS transistors are desired for the loads because of the smaller capacitances normally associated with p-type transistors. A smaller capacitance is desirable at the differential outputs OUT1, OUT2 of the cell. In this configuration, the gate terminal G of the p-channel diode-connected load transistor is tied to the drain terminal D, with the source terminal S tied to VDD. The bulk substrate connection B is also tied to VDD.

While this configuration works well for its intended applications, the delay is often susceptible to jitter components acting on the VDD bus. Even a relatively small change of 0.1 volts can cause a corresponding change in the bias current through the cell, correspondingly affecting the delay characteristics of the cell.

What is needed and currently unavailable is a delay cell for use in a timing generator that causes minimal changes in delay that are attributable to jitter. The delay cell of the present invention satisfies this need.

SUMMARY OF THE INVENTION

The low jitter delay cell of the present invention provides a low-delay solution for the generation of timing delays in a CMOS-based timing generator. By minimizing the delay attributable to changes in VDD, the accuracy and performance of the timing generator is substantially improved.

To realize the foregoing advantages, the invention in one form comprises a differential delay cell. The delay cell includes a voltage bus and a differential pair of MOS transistors having respective source terminals coupled to define a current node, and respective drain terminal outputs that cooperate to form a differential output. A bias current source is disposed at the current node while a differential diode-connected load is disposed between the differential pair and the voltage bus. The differential diode-connected load comprises at least one n-channel MOS transistor configured as a diode.

In another form, the invention comprises a timing generator for use in a semiconductor tester. The timing generator includes a delay line having a plurality of delay cells with respective phase-shifted outputs. Each of the delay cells includes a voltage bus and a differential pair of MOS transistors having respective source terminals coupled to define a current node, and respective drain terminal outputs that cooperate to form a differential output. A bias current source is disposed at the current node while a differential diode-connected load is disposed between the differential pair and the voltage bus. The differential diode-connected load comprises at least one n-channel MOS transistor configured as a diode. The timing generator further includes a multiplexer having a plurality of inputs for receiving the phase shifted delay cell outputs, and an output. Phase detection circuitry detects the phase shift between the multiplexer outputs.

In a further form, the invention comprises a method of delaying a timing signal through a delay cell. The delay cell including a voltage supply bus for providing a bias voltage VDD. The method comprises the steps of generating a bias current in the delay cell, the bias current controlling the amount of delay provided by the delay cell; detecting the timing signal with a differential switch; and establishing a negative-feedback path to compensate for voltage variations on the voltage supply bus.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The delay cell of the present invention provides a low delay solution for high performance CMOS timing generators. This is accomplished by employing a negative feedback circuit at the load, thereby compensating the delay cell bias current and the output capacitance for any changes in VDD caused by noise. By minimizing the effects of a changing VDD, changes to the delay characteristics of the cell are also correspondingly minimized.

Figure 1:
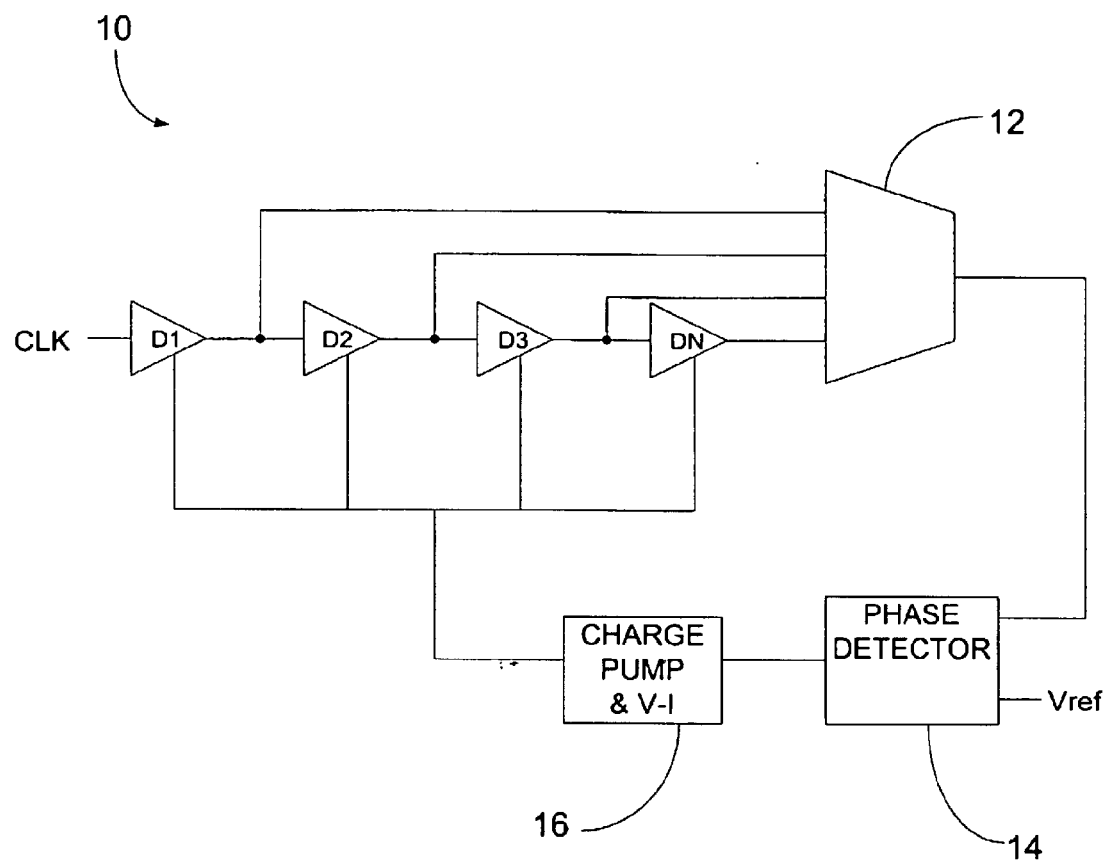
FIG. 1 is a high-level block diagram of a conventional timing generator.
Figure 2:
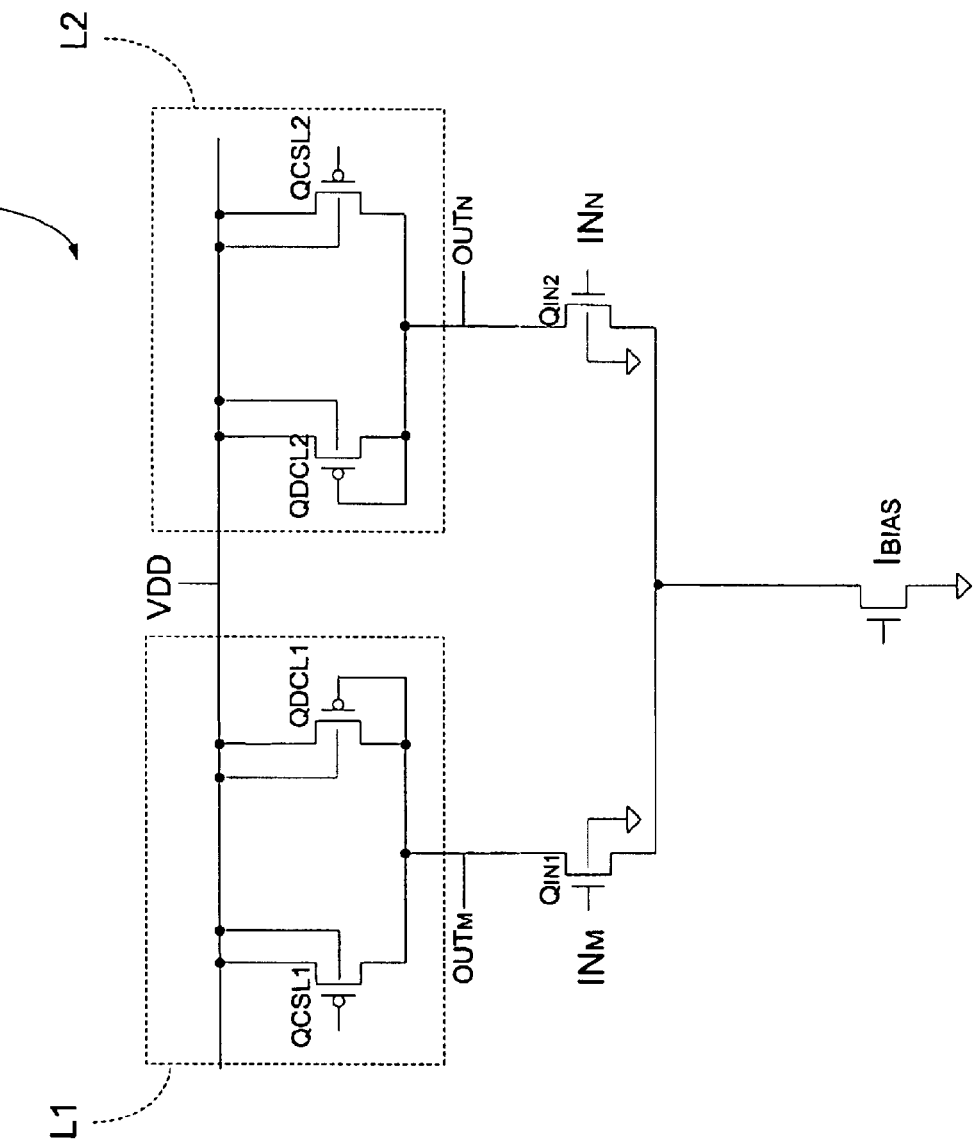
FIG. 2 is a partial schematic view of the conventional delay cell circuitry employed in the timing generator of FIG. 1.
Figure 3:
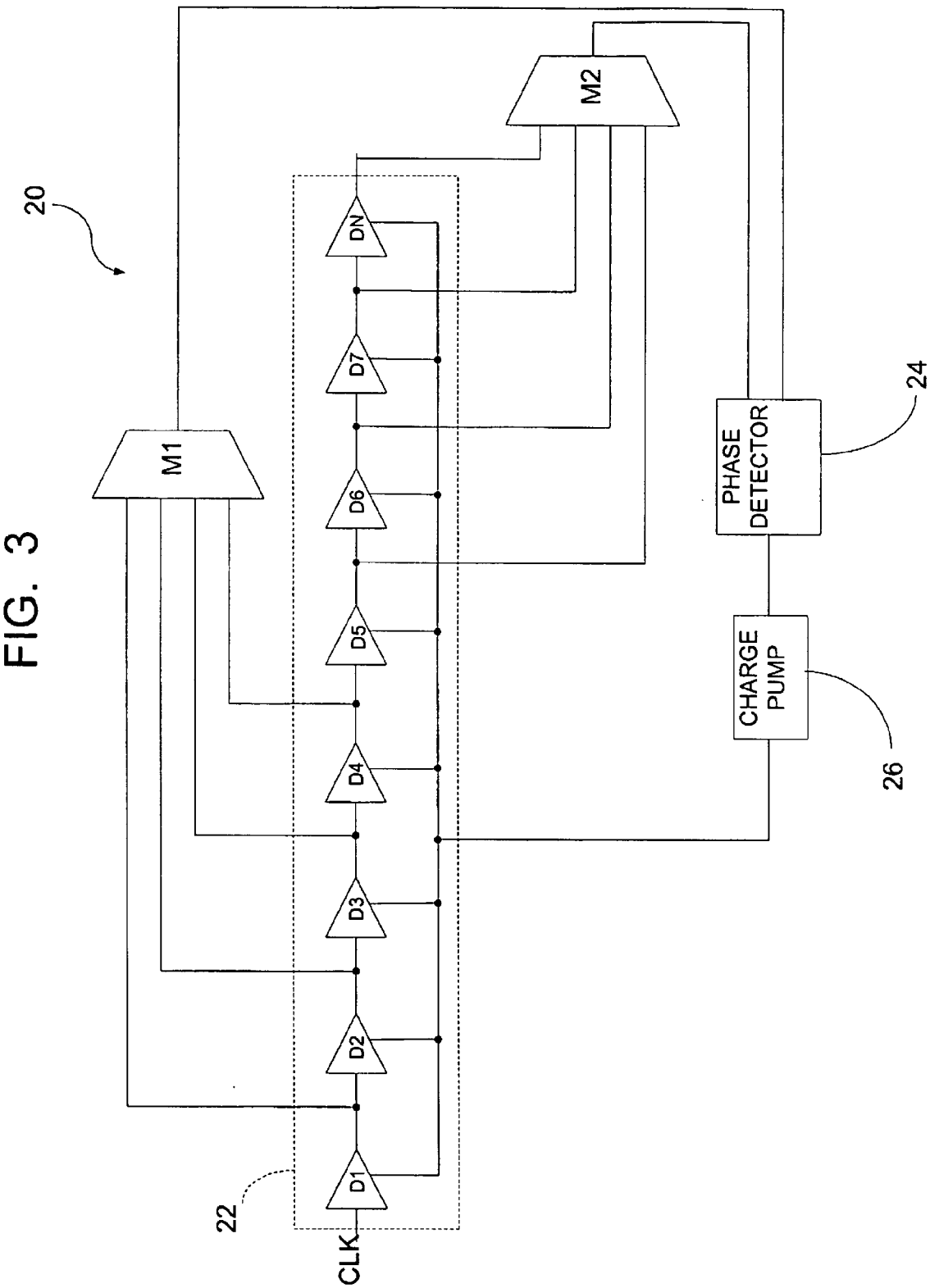
FIG. 3 is a high-level block diagram of a timing generator according to one form of the present invention.

Referring now to FIG. 3, a timing generator according to one form of the present invention, generally designated 20, is shown for use with automatic test equipment. The timing generator is of the type that provides bias current compensation to control delay. The generator includes a delay line 22 comprising a set of N delay elements D1–DN, each providing a proportional to 1/N phase offset with respect to an input clock CLK. The delay line is split into groups, such that the delay element outputs from one group are fed to a first multiplexer M1, and the delay element outputs from a second group are fed to a second multiplexer M2. A preferred construction for each of the multiplexers is described in co-pending patent application Ser. No. 10/259,334, titled "Timing Generator With Low Delay Multiplexer", filed Sep. 27, 2002, assigned to the assignee of the present invention, and expressly incorporated by reference herein.

The outputs of the multiplexers M1 and M2 are coupled to a phase detector 24 for determining the phase difference between the two inputs. A charge pump and voltage-to-current converter 26 receives a difference signal from the phase detector to generate bias current for the delay elements proportional to the phase difference. The change in bias current serves to control the delay through each element to a desired level.

Figure 4:
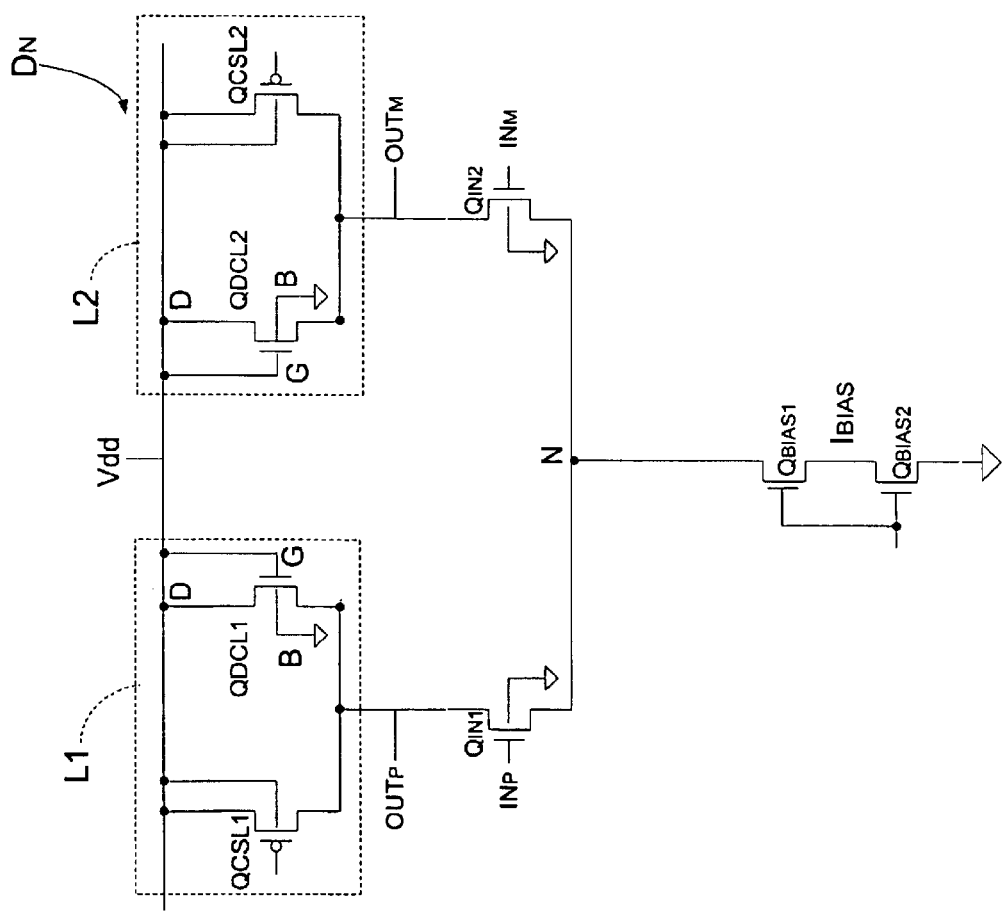
FIG. 4 is a high-level block diagram of a delay cell for use in the timing generator of FIG. 3.

Referring now to FIG. 4, each delay element DN (only one delay element shown for clarity) employs a differential pair of MOS transistors $Q_{IN1}$, $Q_{IN2}$ having respective source terminals tied to a common node N. A bias current source $I_{BIAS}$ is tied to the node. A differential load L1, L2 is coupled between the differential pair and a positive supply voltage $V_{DD}$.

At this point, the construction of the delay cell appears fairly conventional. However, the inventor has discovered that by utilizing n-channel diode connected MOS transistors in the differential load L1, L2, the delay cell DN is able to take advantage of a negative feedback mechanism to offset the effects of a changing $V_{DD}$. By compensating the cell for the effects of a changing VDD (due to noise), undesired changes to the bias current, and hence to the delay of the cell (jitter), are minimized.

More specifically, and with continued reference to FIG. 4, the differential load L1, L2 comprises a pair of n-channel MOS transistors $Q_{NDCL1}$, $Q_{NDCL2}$ configured as diode-connected transistors, and corresponding p-channel MOS current source loads $Q_{CSL1}$, $Q_{CSL2}$. The current source loads are an optional feature, but improve the performance of the cell DN. The n-channel diode-connected load transistors are configured such that the drain and gate terminals D and G are tied to $V_{DD}$, with the bulk terminals B tied to ground. As alluded to above, and more fully explained below, the specific diode-connected load configuration provides a negative feedback mechanism for offsetting the effect to the delay cell bias current resulting from noise-induced variations to $V_{DD}$.

Further referring to FIG. 4, the bias current source $I_{BIAS}$ preferably comprises a cascoded current source including a first n-channel transistor $Q_{BIAS1}$ coupled in series between the node N ad a second n-channel transistor $Q_{BIAS2}$. The base terminal of $Q_{BIAS1}$ is tied to the base of $Q_{BIAS2}$. This configuration provides an optimal output impedance in an effort to make the bias current source as "ideal" as possible (with an infinite output impedance).

In operation, the accuracy of the timing generator 20 (FIG. 3) depends upon the accuracy of the individual delays associated with each delay cell DN. The individual delays are each regulated by the amount of bias current running through each cell DN. Bias current is drawn through the cell by the main current source $I_{BIAS}$, which is programmed by the user to achieve the desired delay for the cell. Generally, a higher bias current results in a shorter delay, while a lower bias current increases the delay. The bias voltage for the cell is provided by the $V_{DD}$ bus, generally on the order of 1.2 volts. However, noise often affects the value of $V_{DD}$, sometimes increasing or decreasing the level by +/-0.10 volts.

Jitter can be especially problematic when trying to calibrate delays provided by the timing generator 20 (FIG. 3). Often, timing signals are looped through the generator multiple times in an effort to identify a range of offsets in the timing output. Jitter effects add uncertainty and imprecision to the calibration, thereby affecting the accuracy of the timing delays.

As an example, for an instantaneous increase in VDD, the voltage drop on the diode connected transistors stays constant. Thus, each delay cells' output voltage OUTN and OUTP increases with the same amount as VDD. The voltage on the common source node (node N) also increases, causing an increase in the bias current flowing through the current source Ibias (because of the transistor's output resistance) An increase in the bias current translates into a faster propagation delay of the cell. Thus, a voltage variation on VDD produces a variation in propagation delay of the cell, which translates to timing jitter. The n-channel diode connected transistors have their substrate connected to ground instead of VDD (in the case of p-channel transistors.)

Thus, when the OUTN and OUTP voltages increase, so does the source-to bulk voltage $V_{SB}$ of the diode-connected loads L1, L2. The $V_{SB}$ increase causes an increase in the threshold voltage of the diode-connected loads L1, L2. This is partly explainable by noting that the transistor threshold voltage Vt depends on the value of $V_{SB}$ by the relationship $V_T = V_{T0} + \gamma[(|2\Phi_F| + V_{SB})^{1/2} - (|2\Phi_F|)^{1/2}]$, where $V_{T0}$ represents the threshold voltage with VSB=0, $\gamma$ represents the body effect coefficient, and $\Phi_F$ represents the Fermi voltage.

The increase in the threshold voltage $V_T$, resulting from the relationship above, causes an increase in the voltage drop on the diode-connected load transistors, which translates into a decrease in the voltages on OUTP and OUTN nodes, and on node N. Thus, the voltage on the drain of the current source transistor Ibias decreases, decreasing the bias current of the cell, and slowing down the propagation delay. Thus, when VDD increases, the backgate modulation effect of the n-channel diode connected loads acts as a negative feedback, opposing the effect of VDD on the propagation delay. Thus, this negative feedback effect reduces the timing jitter due to noise on the VDD supply.

Figure 5:
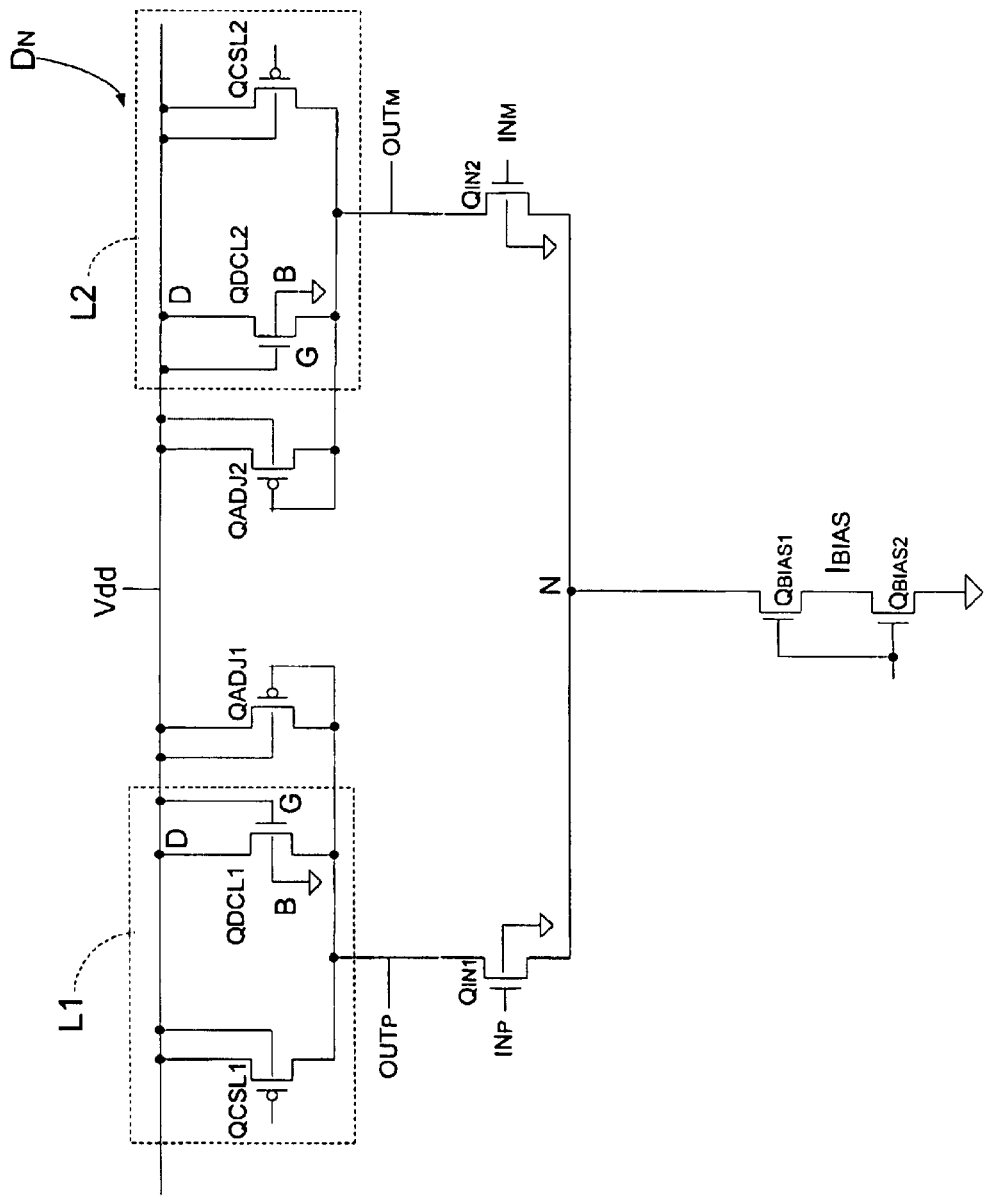
FIG. 5 is a high-level block diagram similar to FIG. 4 illustrating a further embodiment of the invention.

FIG. 5 illustrates a further embodiment of the present invention, incorporating all of the circuitry of FIG. 4, but with the addition of a p-channel MOS transistor $Q_{ADJ1}$, $Q_{ADJ2}$ in parallel with each diode-connected load transistor $Q_{DCL1}$, $Q_{DCL2}$. The inventors have discovered that the amount of feedback produced by the diode-connected transistor can be controlled by varying the ratio of the relative widths of the diode-connected transistors and the additional p-channel transistors.

Those skilled in the art will recognize the many benefits and advantages afforded by the present invention. Of significant importance is the implementation of the negative feedback feature available with the n-channel MOS diode-connected loads. This isolates the delay cell from noise effects acting on the $V_{DD}$ bus. The reduction in jitter substantially improves the delay element performance.

While the invention has been particularly shown and described with reference to the preferred embodiments thereof, it will be understood by those skilled in the art that various changes in form and detail may be made therein without departing from the spirit and scope of the invention.

What is claimed is:

1. A differential delay cell comprising:
   a voltage bus;
   a differential pair of metal-oxide-silicon (MOS) transistors having respective source terminals coupled to define a current node, and respective drain terminal outputs that cooperate to form a differential output;
   a bias current source disposed at the current node; and
   a differential diode-connected load disposed between the differential pair and the voltage bus, the differential diode-connected load comprising at least one n-channel MOS transistor configured as a diode.

2. The differential delay cell of claim 1 wherein the diode-connected load comprises a pair of n-channel MOS transistors.

3. The differential delay cell of claim 1 wherein the diode-connected load further includes at least one current source disposed in parallel with the at least one n-channel MOS transistor.

4. The differential delay cell of claim 3 wherein the at least one current source comprises a pair of current sources, the current sources are disposed in parallel with the at least one n-channel MOS transistor.

5. The differential delay cell of claim 1 wherein the differential diode-connected load further comprises a p-channel MOS transistor disposed in parallel with the at least one n-channel MOS transistor.

6. The differential delay cell of claim 1 wherein the bias current source comprises a cascoded current source.

7. A timing generator for use in a semiconductor tester, the timing generator comprising:
   a delay line having a plurality of delay cells with respective phase-shifted outputs, the delay cells comprising:
      a voltage bus;
      a differential pair of metal-oxide-silicon (MOS) transistors having respective source terminals coupled to define a current node, and respective drain terminal outputs that cooperate to form a differential output;
      a current source disposed at the current node; and
      a differential diode-connected load disposed between the differential pair and the voltage bus, the differential diode-connected load comprising at least one n-channel MOS transistor configured as a diode;
   a multiplexer having a plurality of inputs for receiving the phase shifted outputs, and an output; and
   phase detection circuitry for detecting the phase shift between the multiplexer output and a reference signal.

8. The timing generator of claim 7 wherein the diode-connected load comprises a pair of n-channel MOS transistors.

9. A The timing generator of claim 7 wherein the diode-connected load further includes at least one current source disposed in parallel with the at least one n-channel MOS transistor.

10. The timing generator of claim 9 wherein the at least one current source comprises a pair of current sources, the current sources disposed in parallel with the at least one n-channel MOS transistor.

11. The timing generator of claim 7 wherein the differential diode-connected load further comprises a p-channel MOS transistor disposed in parallel with the at least one n-channel MOS transistor.

12. The timing generator of claim 7 wherein the bias current source comprises a cascoded current source.

13. A method comprising:
   delaying a timing signal through a delay cell, the delay cell including a voltage supply bus for providing a bias voltage, delaying comprising:
      generating a bias current in the delay cell, the bias current controlling the amount of delay provided by the delay cell;
      detecting the timing signal; and
      establishing a negative-feedback path to compensate for voltage variations on the voltage supply bus using a differential diode comprising an n-channel MOS transistor in a diode configuration.

14. The method of claim 13, wherein detecting the timing signal comprises detecting the timing signal using a differential switch comprising a differential pair of metal-oxide-silicon (MOS) transistors.

15. The method of claim 14 wherein establishing a negative-feedback path comprises connecting a differential diode-connected load between the bus and the differential switch.

16. A method comprising:
   compensating for delay based on variations to a bias voltage acting on a bias current of a differential delay cell, the differential delay cell having a differential diode-connected load comprising an n-channel MOS transistor in a diode configuration, compensating comprising establishing a first bias current through the differential delay cell to achieve a desired delay characteristic for the differential delay cell.

17. The method of claim 16, further comprising detecting changes to the bias voltage.

18. The method of claim 17, further comprising compensating for effects on the bias current based on the changes to the bias voltage.

* * * * *